(12) United States Patent
Jonak-Auer et al.

(10) Patent No.: US 11,335,824 B2
(45) Date of Patent: May 17, 2022

(54) NEAR-INFRARED PHOTODETECTOR SEMICONDUCTOR DEVICE

(71) Applicant: ams AG, Premstaetten (AT)

(72) Inventors: Ingrid Jonak-Auer, Premstaetten (AT); Gerald Meinhardt, Premstaetten (AT); Bernhard Löffler, Premstaetten (AT)

(73) Assignee: AMS AG, Premstaetten (AT)

( * ) Notice: Subject to any disclaimer, the term of this patent is extended or adjusted under 35 U.S.C. 154(b) by 25 days.

(21) Appl. No.: 16/763,894

(22) PCT Filed: Nov. 13, 2018

(86) PCT No.: PCT/EP2018/081086
§ 371 (c)(1),
(2) Date: May 13, 2020

(87) PCT Pub. No.: WO2019/101577
PCT Pub. Date: May 31, 2019

(65) Prior Publication Data
US 2020/0350447 A1 Nov. 5, 2020

(30) Foreign Application Priority Data
Nov. 13, 2018 (EP) ..................... 17203572

(51) Int. Cl.
*H01L 31/102* (2006.01)
*H01L 21/00* (2006.01)
(Continued)

(52) U.S. Cl.
CPC ............. *H01L 31/035281* (2013.01); *H01L 27/14649* (2013.01); *H01L 31/028* (2013.01); *H01L 31/105* (2013.01)

(58) Field of Classification Search
CPC .... H01L 27/14649–14652; H01L 2924/12043
(Continued)

(56) References Cited

U.S. PATENT DOCUMENTS

| 7,101,725 B2 * | 9/2006 | Wada | B82Y 20/00 |
| | | | 438/65 |
| 8,269,303 B2 * | 9/2012 | Fujikata | G02B 6/12004 |
| | | | 257/458 |

(Continued)

FOREIGN PATENT DOCUMENTS

| WO | 2006/123881 | 11/2006 |
| WO | 2016/062614 | 4/2016 |

OTHER PUBLICATIONS

European Patent Office, International Search Report for PCT/EP2018/081086 dated Jan. 17, 2019.

(Continued)

*Primary Examiner* — Calvin Lee
(74) *Attorney, Agent, or Firm* — MH2 Technology Law Group LLP

(57) ABSTRACT

The near-infrared photodetector semiconductor device comprises a semiconductor layer (1) of a first type of conductivity with a main surface (10), a trench or a plurality of trenches (2) in the semiconductor layer at the main surface, a SiGe alloy layer (3) in the trench or the plurality of trenches, and an electrically conductive filling material of a second type of conductivity in the trench or the plurality of trenches, the second type of conductivity being opposite to the first type of conductivity.

13 Claims, 2 Drawing Sheets

(51) Int. Cl.
*H01L 31/0352* (2006.01)
*H01L 31/028* (2006.01)
*H01L 31/105* (2006.01)
*H01L 27/146* (2006.01)

(58) Field of Classification Search
USPC ...................................... 438/57–63; 257/458
See application file for complete search history.

(56) References Cited

U.S. PATENT DOCUMENTS

| | | |
|---|---|---|
| 2005/0040445 A1 | 2/2005 | Mouli |
| 2005/0127275 A1 | 6/2005 | Yang |
| 2005/0133723 A1 | 6/2005 | Lee et al. |
| 2008/0277749 A1 | 11/2008 | Enichlmair |
| 2010/0038678 A1 | 2/2010 | Kraft et al. |
| 2011/0012221 A1 | 1/2011 | Fujikata et al. |
| 2015/0028386 A1 | 1/2015 | Shi et al. |

OTHER PUBLICATIONS

Klinger, S. et al.: "Ge-on-Si p-i-n Photodiodes With a 3-dB Bandwidth of 49 GHz" IEEE Photonics Technology Letters, vol. 21, No. 13, Jul. 1, 2009, pp. 920-922.

Loh, T. H. et al.: "Selective epitaxial germanium on silicon-on-insulator high speed photodetectors using low-temperature ultrathin Si0.8Ge0.2 buffer" American Institute of Physics, Applied Physics Letters 91, 2007, pp. 073503-1-073503-03.

\* cited by examiner

NEAR-INFRARED PHOTODETECTOR SEMICONDUCTOR DEVICE

The present disclosure applies to the field of integrated near-infrared photodetector semiconductor devices.

BACKGROUND OF THE INVENTION

Semiconductor photodetector devices for wavelengths in the near infrared (NIR) are applied in optical communication, metrology, imaging and spectroscopy, for instance, and may comprise silicon (Si), germanium (Ge) and SiGe alloys. A monolithic integration of optics and electronics parts is desired in view of system performance and small size.

SUMMARY OF THE INVENTION

The definitions as described above also apply to the following description unless stated otherwise. The term "trench" will be used to denote any suitable opening or recess of arbitrary shape, which can be etched into a semiconductor layer.

The near-infrared photodetector semiconductor device comprises a semiconductor layer of a first type of conductivity with a main surface, a trench or a plurality of trenches in the semiconductor layer at the main surface, a SiGe alloy layer in the trench or the plurality of trenches, and an electrically conductive filling material of a second type of conductivity in the trench or the plurality of trenches, the second type of conductivity being opposite to the first type of conductivity. The first type of conductivity may be n-type conductivity and the second type of conductivity p-type conductivity, for instance, or vice versa.

In an embodiment of the near-infrared photodetector semiconductor device, the SiGe alloy layer is doped for the second type of conductivity, and the filling material comprises a portion of the SiGe alloy layer. The SiGe alloy layer may fill the trench or the plurality of trenches.

A further embodiment comprises a silicon layer in the trench or the plurality of trenches. The silicon layer may especially comprise polysilicon. The SiGe alloy layer and the silicon layer may fill the trench or the plurality of trenches.

In a further embodiment the silicon layer is doped for the second type of conductivity, and the filling material comprises a portion of the silicon layer. In this case the SiGe alloy layer may be undoped or intrinsically doped.

In a further embodiment the SiGe alloy layer is doped for the second type of conductivity, the silicon layer is undoped or intrinsically doped, and the filling material comprises a portion of the SiGe alloy layer.

A further embodiment comprises a contact region of the first type of conductivity in the semiconductor layer at the main surface, the contact region being at a distance from the trench or the plurality of trenches. An electrically conductive contact connection is electrically conductively connected with the filling material, and a further electrically conductive contact connection is electrically conductively connected with the contact region.

In further embodiments the trench or at least one of the trenches of the plurality of trenches has a smooth or a grooved sidewall.

In further embodiments the semiconductor layer of the first type of conductivity is silicon, and the SiGe alloy layer is epitaxially grown on the silicon. A differential or selective epitaxy of the SiGe alloy layer enables to vary and adapt the germanium content during the deposition of the SiGe alloy layer.

The arrangement of the SiGe alloy layer in the trench or the plurality of trenches increases the absorption length and thus improves the light sensitivity of the photodetector semiconductor device in the spectral range of red and near-infrared light.

The following is a more detailed description of examples of the photodetector semiconductor device in conjunction with the appended figures.

DETAILED DESCRIPTION

Figure 1:
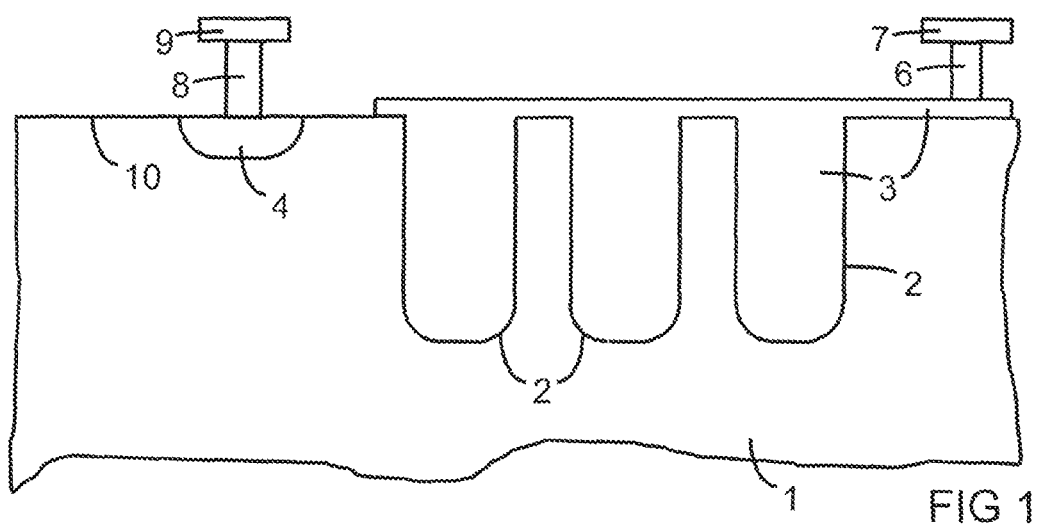
FIG. 1 is a cross section of a photodetector semiconductor device comprising trenches with smooth sidewalls.

FIG. 1 is a cross section of a photodetector semiconductor device. At least one trench 2 is formed at a main surface 10 of a semiconductor layer 1, which may especially be silicon. The semiconductor layer 1 has a first type of conductivity. The number of trenches is arbitrary; FIG. 1 shows a plurality of three trenches 2, by way of example. A SiGe alloy layer 3 is arranged in each trench 2 and on the main surface 10. If the semiconductor layer 1 is silicon, the SiGe alloy layer 3 can be epitaxially grown on the silicon. The SiGe alloy layer 3 comprises silicon and germanium, and it may also comprise an optional additive like carbon, for instance. The shape of the trenches 2 can be adapted to the epitaxial growth. The sidewalls of the trenches 2 can be perpendicular or inclined with respect to the main surface 10. The sidewalls can be smooth, as shown in FIG. 1, or rough. Bottom areas of the trenches 2 can be flat or curved.

The SiGe alloy layer 3 has a second type of conductivity opposite to the first type of conductivity. The first type of conductivity may be n-type conductivity and the second type of conductivity p-type conductivity, or vice versa. The SiGe alloy layer 3 may completely fill the trenches 2, as shown in FIG. 1. In this case the large volume of the SiGe alloy layer 3 enhances the absorption of near-infrared light.

A contact region 4 of the first type of conductivity may be arranged in the semiconductor layer 1 at the main surface 10 and at a distance from the trenches 2. The contact region 4 comprises a doping concentration that is higher than the doping concentration of the semiconductor layer 1 in order to allow the formation of an ohmic contact. A contact connection 6 comprising an electrically conductive material is arranged contacting the SiGe alloy layer 3, and a further contact connection 8 comprising an electrically conductive material is arranged contacting the contact region 4. The contact connections 6, 8 may be formed by plugs in an intermetal dielectric and may connect the SiGe alloy layer 3 and the contact region 4 with conductor tracks 7, 9 in a metal layer of a wiring, for example. Details of the wiring, which are arbitrary, are not shown in FIG. 1.

Figure 2:
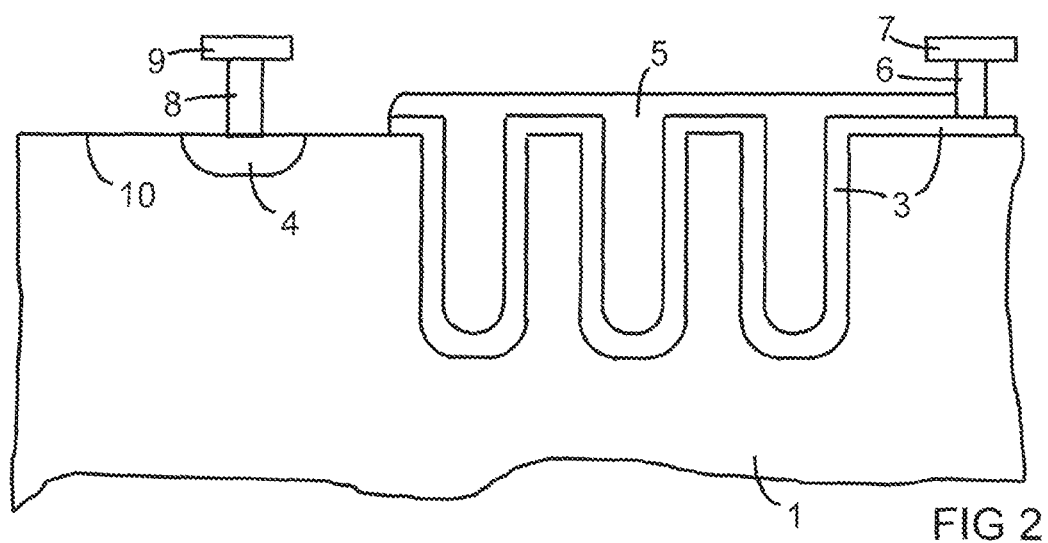
FIG. 2 is a cross section of a further photodetector semiconductor device comprising trenches with smooth sidewalls.

FIG. 2 is a cross section of a further photodetector semiconductor device. Elements of the photodetector semiconductor device according to FIG. 2 that correspond to elements of the photodetector semiconductor device according to FIG. 1 are designated with the same reference numerals. The photodetector semiconductor device according to FIG. 2 comprises a silicon layer 5 in the trenches 2. The silicon layer 5 may especially comprise polysilicon. The SiGe alloy layer 3 and the silicon layer 5 may completely fill the trenches 2. The silicon layer 5 may also be applied on the SiGe alloy layer 3 above the main surface 10, as shown in FIG. 2.

If the SiGe alloy layer 3 is doped for the second type of conductivity, the silicon layer 5 may be undoped or intrinsically doped. In this case the contact connection 6 is arranged in such a manner that it contacts the SiGe alloy layer 3. As the refractive index of silicon is lower than the refractive index of SiGe, total reflection of light at the boundary between the silicon layer 5 and the SiGe alloy layer 3 yields a longer optical path and enhanced light absorption.

The silicon layer 5 may be doped for the second type of conductivity, especially in situ during its deposition. If the silicon layer 5 is doped for the second type of conductivity, the SiGe alloy layer 3 may be undoped or intrinsically doped. In this case the contact connection 6 is arranged in such a manner that it contacts the silicon layer 5. If the SiGe alloy layer 3 is undoped, the space charge region extends over the entire portion of the SiGe alloy layer 3 that is arranged within the trenches 2, and this results in a better carrier collection efficiency.

Figure 3:
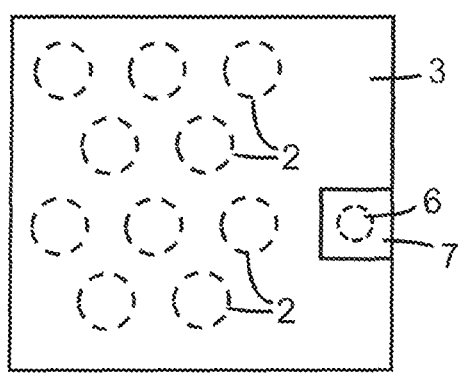
FIG. 3 is a top view of an arrangement of the trenches.

FIG. 3 is a top view of an arrangement of the trenches 2 for an example in which the trenches 2 are cylindrical. The SiGe alloy layer 3 and the conductor track 7 are indicated in FIG. 3 in order to facilitate the comparison with the cross section shown in FIG. 1.

Figure 4:
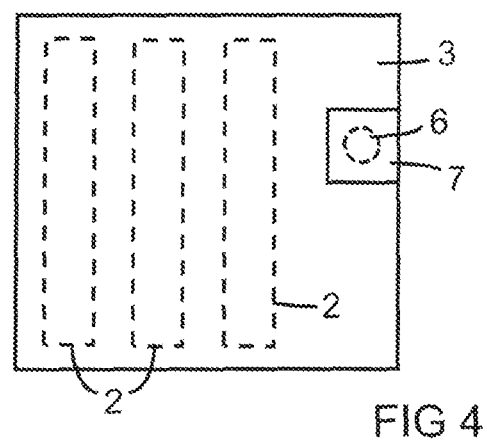
FIG. 4 is a top view of a further arrangement of the trenches.

FIG. 4 is a top view of a further arrangement of the trenches 2 for an example in which the trenches 2 have longitudinal extensions and are parallel to each other. The shapes and arrangements of the trenches 2 are not restricted to these examples, but may vary according to individual requirements.

Longer optical paths can be achieved with trenches 2 comprising grooved or corrugated sidewalls. The trenches 2 can be etched into the semiconductor layer 1, and the etching process can be performed in such a way that it yields grooved or corrugated surfaces of the sidewalls. Such etching processes are known per se in semiconductor technology and need not be described here.

Figure 5:
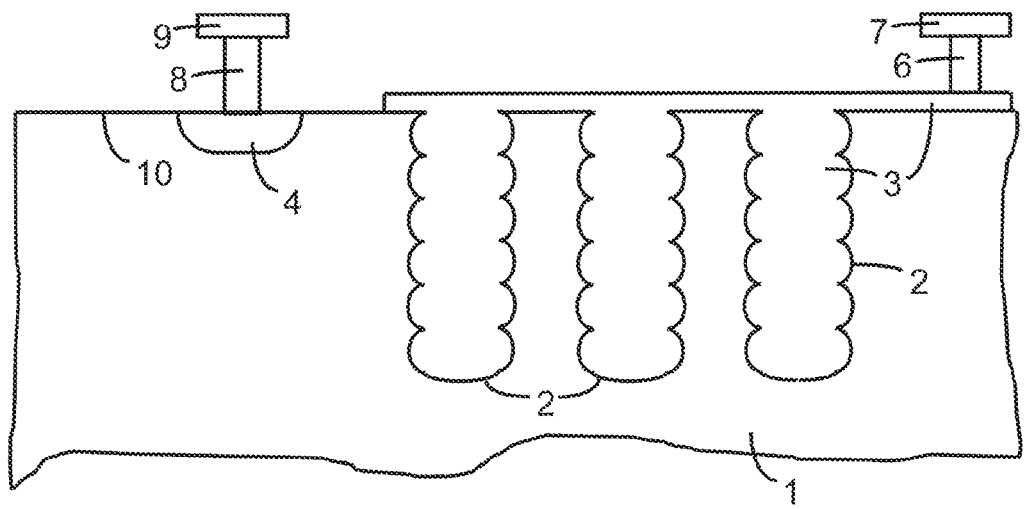
FIG. 5 is a cross section of a photodetector semiconductor device comprising trenches with grooved sidewalls.

FIG. 5 is a cross section of a photodetector semiconductor device comprising trenches 2 with grooved sidewalls. Elements of the photodetector semiconductor device according to FIG. 5 that correspond to elements of the photodetector semiconductor device according to FIG. 1 are designated with the same reference numerals. The shape of the sidewalls makes the difference between the devices according to FIGS. 1 and 5.

Figure 6:
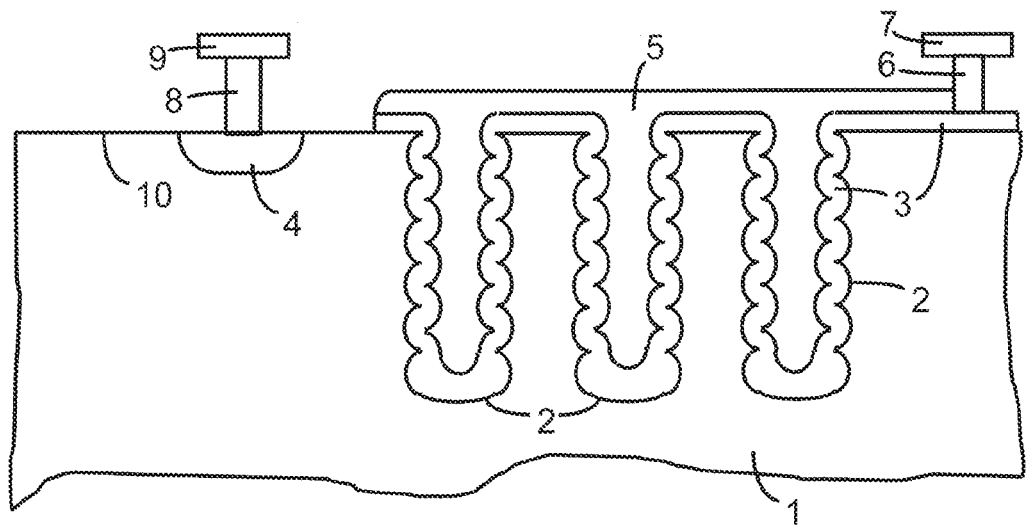
FIG. 6 is a cross section of a further photodetector semiconductor device comprising trenches with grooved sidewalls.

FIG. 6 is a cross section of a further photodetector semiconductor device comprising trenches 2 with grooved sidewalls. Elements of the photodetector semiconductor device according to FIG. 6 that correspond to elements of the photodetector semiconductor device according to FIG. 2 are designated with the same reference numerals. The shape of the sidewalls makes the difference between the devices according to FIGS. 2 and 6.

Figure 7:
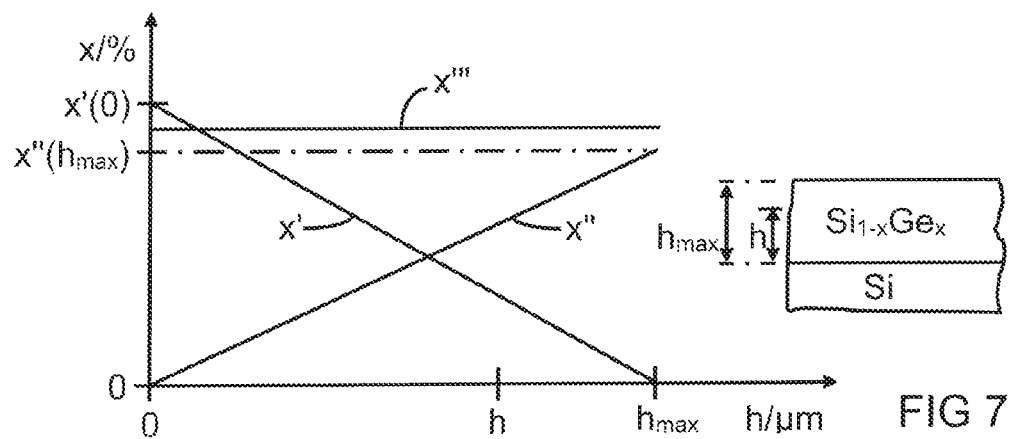
FIG. 7 is a diagram showing examples of the relative germanium content x as a function of the level h above a silicon surface.

FIG. 7 is a diagram showing some examples of the relative germanium content x of the $Si_{1-x}Ge_x$ alloy in the SiGe alloy layer 3 as a function of the level h above the surface on which the SiGe alloy layer 3 is grown. The $Si_{1-x}Ge_x$ alloy may especially be epitaxially grown on a silicon surface, as indicated on the right side of the diagram. The relative germanium content x of the alloy $Si_{1-x}Ge_x$ can be varied during the deposition of the SiGe alloy layer 3, so that the properties of the SiGe alloy layer 3 can be adapted to the requirements of individual embodiments.

The line x' in the diagram of FIG. 7 represents an example of a continuous linear decrease of the germanium content x from h=0 to the maximal level $h_{max}$, which corresponds to the total thickness of the SiGe alloy layer 3. The line x" represents an example of a continuous linear increase of the germanium content x from h=0 to the maximal level $h_{max}$. The relative germanium content x may instead be essentially constant, so that the SiGe alloy layer 3 is homogeneous. Such a SiGe alloy layer 3 is represented in FIG. 1 by the horizontal line x'''.

An integrated circuit of the photodetector semiconductor device can be formed by a conventional CMOS process, for instance, which is known per se and need not be described here. The formation of the trenches 2 and the SiGe alloy layer 3 may take place after the CMOS process. Instead, the trenches 2 can be etched at an earlier stage of the CMOS process. In this case the trenches 2 are subsequently filled with a sacrificial filling, which may be an oxide of the semiconductor material, for instance. After the CMOS process, the sacrificial filling is removed, which may be effected by wet etching, for instance, to open the trenches 2, and the SiGe alloy layer 3 is subsequently deposited.

Deep trenches provide long optical paths within the SiGe alloy layer in the vertical direction. A differential or selective epitaxial growth of the SiGe alloy layer guarantees monocrystalline growth with low defect density at the Si/SiGe interface, thus enabling the formation of photodetectors with low dark current. The efficiency in photocarrier collection is enhanced by an increase of the width of the space charge region within the SiGe alloy. The efficiency in photocarrier collection is also enhanced when the relative germanium content of the SiGe alloy layer continuously increases or decreases with increasing distance from the silicon surface on which the SiGe alloy layer is epitaxially grown. Hence an integrated near-infrared photodetector semiconductor device comprising the described features has many advantages and is favourable for a wide variety of applications.

The invention claimed is:

1. A near-infrared photodetector semiconductor device, comprising:
    a semiconductor layer of a first type of conductivity with a main surface;
    a trench or a plurality of trenches in the semiconductor layer at the main surface;
    a SiGe alloy layer in the trench or the plurality of trenches;
    an electrically conductive filling material of a second type of conductivity in the trench or the plurality of trenches, the second type of conductivity being opposite to the first type of conductivity;
    a silicon layer in the trench or the plurality of trenches, wherein the silicon layer is doped for the second type of conductivity, and the filling material comprises a portion of the silicon layer, and wherein the SiGe alloy layer is undoped or intrinsically doped; and a contact connection connecting the SiGe alloy layer with a conductor track.

2. The near-infrared photodetector semiconductor device according to claim 1, further comprising:
a contact region of the first type of conductivity in the semiconductor layer at the main surface, the contact region being at a distance from the trench or the plurality of trenches,
an electrically conductive contact connection electrically conductively connected with the filling material, and
a further electrically conductive contact connection electrically conductively connected with the contact region.

3. The near-infrared photodetector semiconductor device according to claim 1, wherein the SiGe alloy layer is doped for the second type of conductivity, and the filling material comprises a portion of the SiGe alloy layer.

4. The near-infrared photodetector semiconductor device according to claim 1, wherein the semiconductor layer comprises silicon and the SiGe alloy layer is epitaxially grown on the semiconductor layer.

5. The near-infrared photodetector semiconductor device according to claim 1, wherein the first type of conductivity is p-type conductivity, and the second type of conductivity is n-type conductivity.

6. The near-infrared photodetector semiconductor device according to claim 1, wherein the first type of conductivity is n-type conductivity, and the second type of conductivity is p-type conductivity.

7. The near-infrared photodetector semiconductor device according to claim 1, wherein the trench or at least one of the trenches of the plurality of trenches has a grooved sidewall.

8. The near-infrared photodetector semiconductor device according to claim 1, wherein the trench or at least one of the trenches of the plurality of trenches has a smooth sidewall.

9. The near-infrared photodetector semiconductor device according to claim 1, wherein the SiGe alloy layer and the silicon layer fill the trench or the plurality of trenches.

10. The near-infrared photodetector semiconductor device according to claim 1, wherein the silicon layer comprises polysilicon.

11. The near-infrared photodetector semiconductor device according to claim 1, wherein the SiGe alloy layer is doped for the second type of conductivity, the silicon layer is undoped or intrinsically doped, and the filling material comprises a portion of the SiGe alloy layer.

12. The near-infrared photodetector semiconductor device according to claim 11, wherein
the semiconductor layer is silicon,
the SiGe alloy layer is epitaxially grown on the semiconductor layer in the trench or the plurality of trenches and on the main surface,
the silicon layer is applied on the SiGe alloy layer in the trench or plurality of trenches and above the main surface,
the SiGe alloy layer and the silicon layer completely fill the trench or the plurality of trenches, and
a contact connection contacts the SiGe alloy layer.

13. A near-infrared photodetector semiconductor device, comprising:
a semiconductor layer of a first type of conductivity with a main surface, the semiconductor layer being silicon,
a trench or a plurality of trenches in the semiconductor layer at the main surface,
a SiGe alloy layer in the trench or the plurality of trenches, the SiGe alloy layer being doped for a second type of conductivity opposite to the first type of conductivity,
an electrically conductive filling material of the second type of conductivity in the trench or the plurality of trenches, the filling material comprising a portion of the SiGe alloy layer,
a silicon layer in the trench or the plurality of trenches, the silicon layer being undoped or intrinsically doped,
the SiGe alloy layer being epitaxially grown on the semiconductor layer in the trench or the plurality of trenches and on the main surface,
the silicon layer being applied on the SiGe alloy layer in the trench or the plurality of trenches and above the main surface,
the SiGe alloy layer and the silicon layer completely filling the trench or the plurality of trenches, and
a contact connection contacting the SiGe alloy layer, wherein the semiconductor layer and the SiGe alloy layer form a pn-structure.

* * * * *